MAGAZINE FOR INTEGRATED CIRCUIT MODULES

Filed Oct. 6, 1967

INVENTOR.
Claus P.J. Suverkropp
BY Fiehe, Kohlbach, Best, Albritton & Herbert
Attorneys

United States Patent Office 3,435,949
Patented Apr. 1, 1969

3,435,949
MAGAZINE FOR INTEGRATED CIRCUIT MODULES

Claus P. J. Suverkropp, Sunnyvale, Calif., assignor to Signetics Corporation, Sunnyvale, Calif., a corporation of California Filed Oct. 6, 1967, Ser. No. 673,363
Int. Cl. B65d 83/00
U.S. Cl. 206—56 10 Claims

ABSTRACT OF THE DISCLOSURE

A magazine for integrated circuit modules or other semiconductor assemblies includes a plurality of long, parallel compartments, each to support in end-to-end relation a number of dual, in-line-type modules. The magazine is formed from two pieces of sheet material secured together between the compartments, and a removable closure blocks the open ends of the compartments. Provisions for subdividing the magazine by removing one or more compartments are included to afford magazines of smaller capacity.

*Background of the invention*

This invention pertains to containers and relates more specifically to a container for accommodating a large plurality of semiconductor assemblies such as integrated circuit modules.

It is well understood that integrated circuit modules have greatly altered electronic technology, and their applications will in time cover a vast range. Integrated circuit modules are generally of small size and have extending therefrom a plurality of metal leads susceptible to bending when the modules are not carefully handled. Moreover, when considered on a weight basis, integrated circuit modules are quite expensive and thus it is apparent that all necessary safeguards should be taken to protect the modules from damage from the point of manufacture through the distribution and marketing channels to the point of end use.

While it may be economically sensible to package modules individually, savings in packaging and production handling are realized when a large number of integrated circuit modules are packaged in a single container. It is quite desirable that a container for integrated circuit modules afford placement and removal of modules without bending or otherwise damaging the module's leads. The placement of the module within the magazine or container should be such that the leads do not inhibit loading or unloading of the magazine. A desirable feature in a magazine for integrated circuit modules is a provision permitting rapid removal of the modules for feeding to a machine on a production line. Where a large number of integrated circuit modules are disposed in a single magazine or container, it is advantageous that the magazine or container may be easily divided by separating one part from the other when there is a need for a smaller quantity of modules.

*Summary of the invention and objects*

The magazine serves to contain semiconductor assemblies such as integrated circuit modules each having a body and leads extending therefrom, the magazine being closed on one end and includes a plurality of spaced apart, elongate compartments each having a first zone for receiving the module body and second zones for receiving the module leads. A module support member maintains the module body in the first zone and a closure member is removably mounted for closing the end on the magazine.

A general object of the invention is to provide a magazine for containing a large number of integrated circuit modules in a secure, damage free manner and wherein the magazine may be reloaded and reused if desired.

Another object of the invention is to provide a magazine which is configurated to contain a plurality of semiconductor assemblies and which may be readily formed from two pieces of sheet material, such as for example thermoplastic sheet material.

Still another object of the invention is to provide a magazine wherein a plurality of integrated circuit modules are supported in a manner whereby the leads are in no danger of being bent nor disposed to interfere with removal of the modules from the magazine.

Further objects and features of the invention will appear from the following description in which the preferred embodiment of the invention has been set forth in detail in conjunction with the accompanying drawing.

*Description of the preferred embodiment*

Figures 1, 2:
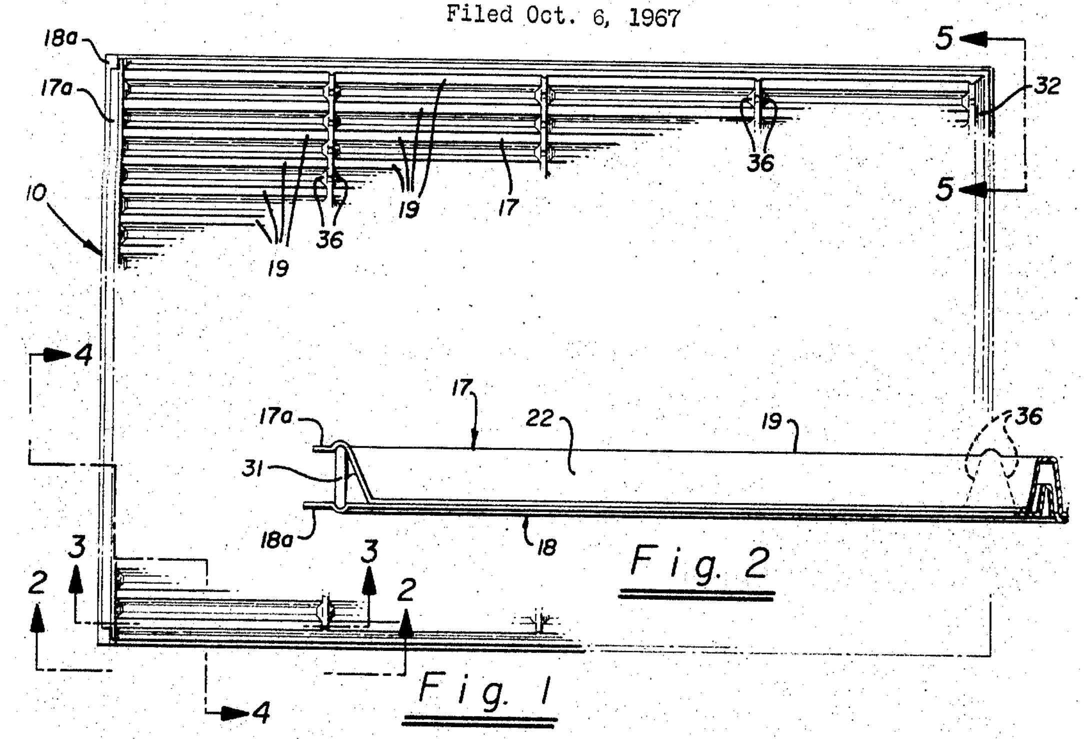
FIGURE 1 is a plan view, partially fragmentary, of a magazine for containing semiconductor assemblies of the present invention.
FIGURE 2 is a vertical sectional view taken along the lines 2—2 in the direction of the arrows in FIGURE 1.
Figure 3:
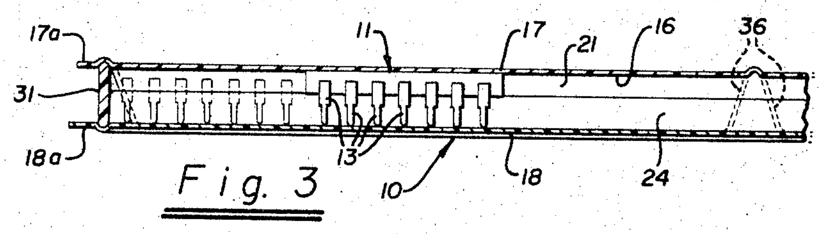
FIGURE 3 is a view like FIGURE 2 but taken in the direction of the arrows along the line 3—3 of FIGURE 1.
Figure 4:
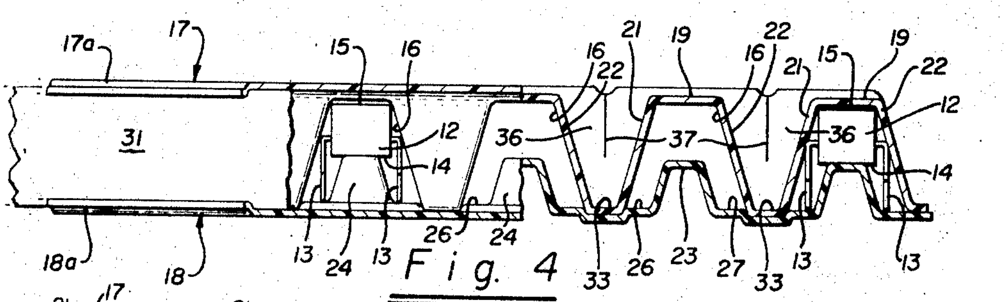
FIGURE 4 is an enlarged vertical sectional view taken in the direction of the arrows along the line 4—4 of FIGURE 1.
Figure 5:
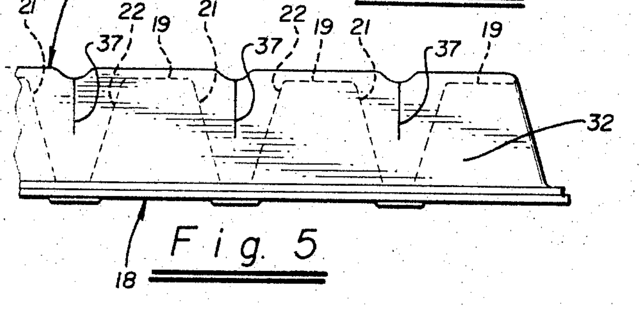
FIGURE 5 is a fragmentary elevational view of the end of the magazine taken in the direction of the arrows along the line 5—5 of FIGURE 1.

There is shown in the drawing a magazine or container 10 for holding a plurality of semiconductor assemblies such as the integrated circuit modules 11 which are of the dual-in-line package configuration. As shown in FIGURES 3 and 4, this package shape of integrated circuit modules includes a body 12 having upper 15 and lower 14 surfaces. Two rows of leads 13 extend from opposite sides of the body (seven pairs being shown herein) and terminate at points below the undersurface 14 of the module body. In this configuration the surface 14 is unobstructed by leads. Integrated circuit modules perform functions well known in the electronic art, serving, for example, as operational amplifiers, bit memory cells and so forth.

The magazine 10 affords provisions for containing a large plurality of integrated circuit modules 11 and, for example, in this embodiment as many as five hundred may be contained within the magazine. More specifically, there are arranged within the housing of the magazine 10 twenty elongate compartments 16 disposed in spaced parallel relation, configurated to receive and support the modules 11 in endwise relationship, twenty-five to a compartment. Preferably, the magazine 10 is formed from two pieces of relatively thin sheet material, an upper member 17 and a lower member 18. The upper member 17 provides for the compartment 16 the top 19 and the outwardly diverging sidewalls 21 and 22. The bottom member 18 provides the bottom wall 23 which includes a raised central support 24 disposed between parallel side or flank portions 26 and 27.

Viewing the compartment 16 in cross section as shown in FIGURE 4, the top and side walls 19, 21, 22 appear trapizoidal as does the support 24 formed on the bottom wall 23. The spacing between the top of the support 24 and the top wall 19 is just slightly larger than the thickness of the module body to establish a first zone into which the module body may be snuggly fitted. Similarly, the distance between the side walls 21, 22 and the support 24 is such as to define a second zone on each side of the support to accommodate the leads in a manner so that a module may slide into and out of the compartment 16 unobstructed and substantially without interference from the sidewalls. The spacing of the top surface of the support 24 from the flank portions 26 is such that the tips of the leads 13 are in slight or in no engagement with the flank portions 26, 27.

A closure member 31, which may be a flat strip of material, is removably mounted at one end of the magazine 10 for sliding in a shallow slot or groove formed in the margins 17*a*, 18*a*, respectively, of the upper and lower portions thereby forming a secure closure. The opposite end of the magazine from the member 31 includes an end wall 32 formed integrally with the upper member 17 and fixedly secured to the lower member 18.

In general, the form of the upper 17 and lower 18 members are planar corrugated sheets, the corrugations or indentations being substantially the same pitch. However, the corrugations or indentations of the lower member are shorter in depth than those of the upper member. Considered from this point of view, when the upper and lower members are superimposed and joined, the depending portions which comprise the top 19 and side 21 walls are provided by the corrugations of the upper member and the supports 24 are provided by the corrugations of the lower member or sheet.

To afford high strength, long service life, and reusability the upper and lower members may be united to one another along a plurality of spaced locations as by cementing or the like. More specifically, it will be seen that the lower ends of the side walls 21, 22 each merge into a narrow web 33 which is received in a complimentary formed depression in the lower member 18. A layer of cement may be placed between interface of the upper and lower members at the web 33 or a heat weld may be effected with selected materials, well known in the art. The sidewalls and support members provide longitudinal stiffness to the magazine.

At longitudinally spaced intervals along the magazine transverse reinforcement is provided by the spaced elements 36 which extend between adjacent side walls. Each spacer element 36 is provided with an incipient or incomplete slit 37 so that one or more compartments may be removed from the magazine by slitting down the web 33 and through the member 36 with a sharp, razor-blade-like instrument. In this manner the magazine may be divided when there is a need for a magazine to contain fewer than the five hundred modules contained by the exemplary embodiment.

The present magazine has twenty compartments 16 although this invention contemplates that a greater or lesser number could be provided in a magazine. Various methods of forming the magazine are available including vacuum forming of thermoplastic sheet material, or injection moulding in a one piece body, as well as other procedures, which will occur to those skilled in the art.

In view of the above it is apparent that there has been provided a magazine for containing a plurality of semiconductor assemblies in a manner permitting ready insertion and withdrawal of the assemblies from the magazine. When the assemblies are placed on the support member 24 there is little or no engagement of the side of the assembly or tips of the lead with the adjacent wall portions. Thus the semiconductor assemblies or modules may be slid the full length of the compartment 16 both when introducing and withdrawing them from the housing of the magazine. In this fashion there is little danger that the leads 13 will become bent or deformed, or that the leads will impede withdrawal of the modules from the compartment 16. Furthermore, to remove the modules from the magazine does not require destruction of the magazine and thus the magazine may be reused should it be desired.

I claim:

1. A magazine for semiconductor assemblies of the type having a semiconductor element encapsulated in a body, the body having upper and lower surfaces with leads extending in two directions from the body and terminating in a pair of spaced parallel rows at points below the lower surface of the body, said magazine comprising a housing having spaced, parallel upper and lower walls and a plurality of spaced side walls joined to the upper and lower walls to form at least one four-sided, elongate compartment, said compartment being dimensioned so that it has a width and height slightly greater than the corresponding dimensions of the semiconductor assembly, said compartment also being dimensioned so that it has a length which is substantially greater than the length of an individual semiconductor assembly so that a plurality of the semiconductor assemblies can be mounted end to end in each compartment, said lower wall of the compartment being formed with an intermediate raised portion and a pair of spaced parallel lower portions extending longitudinally of the compartment, said spaced parallel lower portions having substantially the same spacing as the leads of the semiconductor assemblies whereby said semiconductor assemblies can be mounted end to end in said compartment with the lower surface of the semiconductor assembly resting upon the intermediate portion of the lower wall with the leads extending toward the spaced parallel lower portions, and means for the ends of said one compartment to retain the semiconductor assemblies therein.

2. The magazine as in claim 1 wherein said upper and lower walls and said side walls form a plurality of spaced parallel compartments.

3. A magazine as in claim 1 wherein said closure means for at least one end of the compartment is slidably removable.

4. A magazine as in claim 2 wherein said top wall and said side walls are formed of a single sheet of material in which the top wall is provided with a plurality of spaced parallel indentations extending longitudinally of the top wall which provides the surfaces which form the side walls of adjacent compartments.

5. A magazine as in claim 4 wherein said indentations are substantially V-shaped in cross section and wherein said side wall surfaces are inclined.

6. A magazine as in claim 4 wherein said side wall surfaces are inclined.

7. A magazine as in claim 4 wherein said lower wall is formed of a single sheet of material with the raised portions being formed with a plurality of spaced, parallel downwardly facing grooves therein extending longitudinally of the lower wall, said indentations of the top wall which form the side walls have a height which is substantially greater than the height of the raised portions of the lower wall so that there is sufficient space between the upper surface of the raised portion and the lower surface of the top wall to accommodate the body of the semiconductor assembly, and means securing the lower portion of said indentations of the top wall to the lower wall to form the two sheets into a unitary assembly.

8. A magazine as in claim 4 together with reinforcing portions carried by the top wall extending into the indentations of the top wall to provide transverse rigidity to the magazine.

9. In a magazine for a semiconductor assembly of the type having a semiconductor element encapsulated in a body, said body having upper and lower surfaces with leads extending from the body in two directions and terminating in a pair of spaced, parallel rows below the lower surface of the body, first and second sheets formed of a relatively thin material, said first sheet being formed with a plurality of spaced, parallel depending portions extending longitudinally of the sheet, said second sheet being formed with a plurality of spaced, parallel upwardly extending portions, said depending portions of the first sheet having a height which is substantially greater than the height of the upwardly extending portions of the second sheet, and means for securing the depending portions of the first sheet to the second sheet so that the upwardly extending portions of the second sheet extend between the depending portions of the first sheet to provide a plurality of spaced parallel compartments in which the depending portions of the first sheet form the side walls and the remaining portions of the first sheet form the top wall and wherein the second sheet forms the bottom wall with the upwardly extending portions of the bottom wall being spaced from the depending portions of the top wall to provide a pair of spaced parallel recesses extending longitudinally of each compartment on opposite sides of each upwardly extending portion of the bottom wall, said compartment being dimensioned so that the body of the semiconductor assembly can be received between the upwardly extending portion of the second sheet and the remaining portions of the top sheet and wherein the leads of the semiconductor assembly extend into the pair of spaced parallel recesses in the compartment, said compartment having a length so that a plurality of semiconductor assemblies can be mounted in the compartment end to end, and closure means carried by the first and second sheets for closing the ends of the compartments.

10. A magazine as in claim 9 together with reinforcing means carried by the first sheet spaced longitudinally along the first sheet and extending transversely thereof to give stiffness to the magazine, said depending portions of the first sheet and the upwardly extending portions in the second sheet serving to give stiffness to the magazine in a longitudinal direction.

References Cited

UNITED STATES PATENTS

| | | | |
|---|---|---|---|
| 3,176,838 | 4/1965 | Duval | 206—65 |
| 3,184,056 | 5/1965 | Kisor | 206—65 |

JAMES B. MARBERT, *Primary Examiner.*